(12) United States Patent
Liu

(10) Patent No.: US 9,454,997 B2
(45) Date of Patent: Sep. 27, 2016

(54) ARRAY OF NONVOLATILE MEMORY CELLS HAVING AT LEAST FIVE MEMORY CELLS PER UNIT CELL, HAVING A PLURALITY OF THE UNIT CELLS WHICH INDIVIDUALLY COMPRISE THREE ELEVATIONAL REGIONS OF PROGRAMMABLE MATERIAL, AND/OR HAVING A CONTINUOUS VOLUME HAVING A COMBINATION OF A PLURALITY OF VERTICALLY ORIENTED MEMORY CELLS AND A PLURALITY OF HORIZONTALLY ORIENTED MEMORY CELLS; ARRAY OF VERTICALLY STACKED TIERS OF NONVOLATILE MEMORY CELLS

(75) Inventor: Jun Liu, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 12/959,015

(22) Filed: Dec. 2, 2010

(65) Prior Publication Data
US 2012/0140542 A1    Jun. 7, 2012

(51) Int. Cl.
*G11C 5/02* (2006.01)
*H01L 27/24* (2006.01)
(Continued)

(52) U.S. Cl.
CPC ............ *G11C 5/02* (2013.01); *G11C 13/0002* (2013.01); *H01L 27/0688* (2013.01);
(Continued)

(58) Field of Classification Search
CPC . G11C 5/02; G11C 13/0002; G11C 2213/71; H01L 27/249; H01L 27/0688; H01L 27/101; H01L 27/2481; H01L 45/1226; H01L 45/04; H01L 45/147; H01L 45/144; H01L 45/14; H01L 45/146; H01L 45/145

USPC ...... 365/51, 105, 115, 4, 175, 243; 257/301, 257/302; 438/386
See application file for complete search history.

(56) References Cited

U.S. PATENT DOCUMENTS 4,715,685 A    12/1987  Yaniv et al.
4,964,080 A    10/1990  Tzeng
(Continued)

FOREIGN PATENT DOCUMENTS

CN    1339159    3/2002
CN    1444284    9/2003
(Continued)

OTHER PUBLICATIONS

U.S. Appl. No. 12/701,885, filed Feb. 8, 2010, Sandhu et al.
(Continued)

*Primary Examiner* — Tha-o H Bui
(74) *Attorney, Agent, or Firm* — Wells St. John, P.S.

(57) ABSTRACT

Disclosed is an array of nonvolatile memory cells includes five memory cells per unit cell. Also disclosed is an array of vertically stacked tiers of nonvolatile memory cells that includes five memory cells occupying a continuous horizontal area of $4F^2$ within an individual of the tiers. Also disclosed is an array of nonvolatile memory cells comprising a plurality of unit cells which individually comprise three elevational regions of programmable material, the three elevational regions comprising the programmable material of at least three different memory cells of the unit cell. Also disclosed is an array of vertically stacked tiers of nonvolatile memory cells that includes a continuous volume having a combination of a plurality of vertically oriented memory cells and a plurality of horizontally oriented memory cells. Other embodiments and aspects are disclosed.

47 Claims, 8 Drawing Sheets

(51) Int. Cl.
*H01L 27/10* (2006.01)
*H01L 27/06* (2006.01)
*G11C 13/00* (2006.01)
*H01L 45/00* (2006.01)

(52) U.S. Cl.
CPC .......... *H01L 27/101* (2013.01); *H01L 27/249* (2013.01); *H01L 27/2481* (2013.01); *G11C 2213/71* (2013.01); *H01L 45/04* (2013.01); *H01L 45/08* (2013.01); *H01L 45/085* (2013.01); *H01L 45/1226* (2013.01); *H01L 45/1233* (2013.01); *H01L 45/14* (2013.01); *H01L 45/142* (2013.01); *H01L 45/143* (2013.01); *H01L 45/144* (2013.01); *H01L 45/145* (2013.01); *H01L 45/146* (2013.01); *H01L 45/147* (2013.01)

(56) References Cited

U.S. PATENT DOCUMENTS

| | | |
|---|---|---|
| 5,049,970 A | 9/1991 | Tanaka et al. |
| 5,122,476 A | 6/1992 | Fazan et al. |
| 6,034,882 A | 3/2000 | Johnson et al. |
| 6,218,696 B1 * | 4/2001 | Radius .......... 257/302 |
| 6,524,867 B2 | 2/2003 | Yang et al. |
| 6,552,952 B2 | 4/2003 | Pascucci |
| 6,687,147 B2 | 2/2004 | Frickie et al. |
| 6,693,821 B2 | 2/2004 | Hsu et al. |
| 6,693,846 B2 | 2/2004 | Fibranz |
| 6,717,881 B2 | 4/2004 | Oishi |
| 6,753,561 B1 | 6/2004 | Rinerson et al. |
| 6,753,562 B1 | 6/2004 | Hsu et al. |
| 6,757,188 B2 | 6/2004 | Perner et al. |
| 6,778,421 B2 | 8/2004 | Tran |
| 6,785,159 B2 | 8/2004 | Tuttle |
| 6,806,531 B1 | 10/2004 | Chen et al. |
| 6,834,008 B2 | 12/2004 | Rinerson et al. |
| 6,873,544 B2 | 3/2005 | Perner |
| 6,905,937 B2 | 6/2005 | Hsu et al. |
| 6,930,324 B2 | 8/2005 | Kowalski et al. |
| 6,940,113 B2 | 9/2005 | Hsu et al. |
| 6,946,702 B2 | 9/2005 | Jang |
| 6,950,369 B2 | 9/2005 | Kunikiyo et al. |
| 6,955,992 B2 | 10/2005 | Zhang et al. |
| 6,958,273 B2 | 10/2005 | Chen et al. |
| 6,961,258 B2 | 11/2005 | Lowrey |
| 6,970,375 B2 | 11/2005 | Rinerson et al. |
| 6,972,211 B2 | 12/2005 | Hsu et al. |
| 6,985,374 B2 | 1/2006 | Yamamura |
| 7,002,197 B2 | 2/2006 | Perner et al. |
| 7,005,350 B2 | 2/2006 | Walker et al. |
| 7,009,278 B2 | 3/2006 | Hsu |
| 7,026,911 B2 | 4/2006 | Aono et al. |
| 7,029,924 B2 | 4/2006 | Hsu et al. |
| 7,029,925 B2 | 4/2006 | Celii et al. |
| 7,035,141 B1 | 4/2006 | Tripsas et al. |
| 7,046,550 B1 | 5/2006 | Reohr et al. |
| 7,050,316 B1 | 5/2006 | Lin et al. |
| 7,067,862 B2 | 6/2006 | Rinerson et al. |
| 7,085,167 B2 | 8/2006 | Lee et al. |
| 7,109,544 B2 | 9/2006 | Schloesser et al. |
| 7,123,535 B2 | 10/2006 | Kurotsuchi et al. |
| 7,149,108 B2 | 12/2006 | Rinerson et al. |
| 7,167,387 B2 | 1/2007 | Sugita et al. |
| 7,180,160 B2 | 2/2007 | Ferrant et al. |
| 7,187,201 B1 | 3/2007 | Trimberger |
| 7,193,267 B2 | 3/2007 | Hsu et al. |
| 7,205,238 B2 | 4/2007 | Pan et al. |
| 7,233,024 B2 * | 6/2007 | Scheuerlein et al. .......... 257/74 |
| 7,236,389 B2 | 6/2007 | Hsu |
| 7,247,876 B2 | 7/2007 | Lowrey |
| 7,273,791 B2 | 9/2007 | Basceri et al. |
| 7,323,349 B2 | 1/2008 | Hsu et al. |
| 7,388,775 B2 | 6/2008 | Bedeschi et al. |
| 7,393,785 B2 | 7/2008 | Uhlenbrock et al. |
| 7,405,967 B2 | 7/2008 | Kozicki et al. |
| 7,420,199 B2 | 9/2008 | Gutsche et al. |
| 7,459,715 B2 | 12/2008 | Toda et al. |
| 7,465,675 B2 | 12/2008 | Gwan-Hyeob |
| 7,473,982 B2 | 1/2009 | Aono et al. |
| 7,489,552 B2 | 2/2009 | Kurotsuchi et al. |
| 7,525,410 B2 | 4/2009 | Aono et al. |
| 7,538,338 B2 | 5/2009 | Rinerson et al. |
| 7,544,987 B2 | 6/2009 | Lu et al. |
| 7,557,424 B2 | 7/2009 | Wong et al. |
| 7,560,815 B1 | 7/2009 | Vaartstra et al. |
| 7,570,511 B2 | 8/2009 | Cho et al. |
| 7,639,523 B2 | 12/2009 | Celinska et al. |
| 7,666,526 B2 | 2/2010 | Chen et al. |
| 7,671,354 B2 | 3/2010 | Happ et al. |
| 7,671,417 B2 | 3/2010 | Yoshida et al. |
| 7,679,812 B2 | 3/2010 | Sasagawa et al. |
| 7,687,793 B2 | 3/2010 | Harshfield et al. |
| 7,687,840 B2 | 3/2010 | Shinmura |
| 7,696,077 B2 | 4/2010 | Liu |
| 7,700,935 B2 | 4/2010 | Kim et al. |
| 7,727,908 B2 | 6/2010 | Ahn et al. |
| 7,737,428 B2 | 6/2010 | Symanczyk et al. |
| 7,751,163 B2 | 7/2010 | Duch et al. |
| 7,755,076 B2 | 7/2010 | Lung |
| 7,768,812 B2 | 8/2010 | Liu |
| 7,772,580 B2 | 8/2010 | Hofmann et al. |
| 7,777,215 B2 | 8/2010 | Chien et al. |
| 7,799,672 B2 | 9/2010 | Hashimoto et al. |
| 7,838,861 B2 | 11/2010 | Klostermann |
| 7,842,991 B2 | 11/2010 | Cho et al. |
| 7,864,568 B2 | 1/2011 | Fujisaki et al. |
| 7,898,839 B2 | 3/2011 | Aoki |
| 7,907,436 B2 | 3/2011 | Maejima et al. |
| 7,910,909 B2 | 3/2011 | Kim et al. |
| 7,948,784 B2 | 5/2011 | Kajigaya |
| 7,952,914 B2 | 5/2011 | Baek et al. |
| 7,990,754 B2 | 8/2011 | Azuma et al. |
| 8,021,897 B2 | 9/2011 | Sills et al. |
| 8,043,926 B2 | 10/2011 | Cho et al. |
| 8,053,364 B2 | 11/2011 | French et al. |
| 8,093,576 B1 | 1/2012 | Lee |
| 8,094,477 B2 | 1/2012 | Maejima |
| 8,098,520 B2 | 1/2012 | Seigler et al. |
| 8,106,375 B2 | 1/2012 | Chen et al. |
| 8,124,968 B2 | 2/2012 | Koo et al. |
| 8,154,908 B2 | 4/2012 | Maejima et al. |
| 8,154,909 B2 | 4/2012 | Azuma et al. |
| 8,237,140 B2 | 8/2012 | Lung et al. |
| 8,295,077 B2 | 10/2012 | Murooka |
| 8,355,274 B2 | 1/2013 | Arita et al. |
| 8,367,544 B2 | 2/2013 | Cheng et al. |
| 8,377,741 B2 | 2/2013 | Savransky et al. |
| 8,395,935 B2 | 3/2013 | Lung et al. |
| 8,404,514 B2 | 3/2013 | Lee et al. |
| 8,411,477 B2 | 4/2013 | Tang et al. |
| 8,436,414 B2 | 5/2013 | Tanaka et al. |
| 8,536,556 B2 | 9/2013 | Fukumizu |
| 8,537,592 B2 | 9/2013 | Liu |
| 8,542,513 B2 | 9/2013 | Tang et al. |
| 8,611,121 B2 | 12/2013 | Ahn et al. |
| 8,854,863 B2 | 10/2014 | Liu |
| 2002/0018355 A1 * | 2/2002 | Johnson et al. ............... 365/103 |
| 2002/0034117 A1 | 3/2002 | Okazawa |
| 2002/0079524 A1 * | 6/2002 | Dennison ...................... 257/296 |
| 2002/0196695 A1 | 12/2002 | Pascucci |
| 2003/0031047 A1 | 2/2003 | Anthony et al. |
| 2003/0086313 A1 | 5/2003 | Asao |
| 2003/0174042 A1 | 9/2003 | Aono et al. |
| 2003/0174570 A1 | 9/2003 | Oishi |
| 2003/0185049 A1 | 10/2003 | Fricke et al. |
| 2003/0218902 A1 | 11/2003 | Perner et al. |
| 2003/0218929 A1 | 11/2003 | Fibranz |
| 2003/0223283 A1 | 12/2003 | Kunikiyo |
| 2004/0002186 A1 | 1/2004 | Vyvoda et al. |
| 2004/0090841 A1 | 5/2004 | Perner et al. |
| 2004/0100835 A1 | 5/2004 | Sugibayashi et al. |
| 2004/0108528 A1 | 6/2004 | Hsu et al. |

(56) References Cited

U.S. PATENT DOCUMENTS

| | | |
|---|---|---|
| 2004/0124407 A1 | 7/2004 | Kozicki et al. |
| 2004/0188714 A1 | 9/2004 | Scheuerlein |
| 2004/0245547 A1 | 12/2004 | Stipe |
| 2005/0001257 A1 | 1/2005 | Scholesser et al. |
| 2005/0014325 A1 | 1/2005 | Aono et al. |
| 2005/0032100 A1 | 2/2005 | Heath et al. |
| 2005/0054119 A1 | 3/2005 | Hsu et al. |
| 2005/0128799 A1 | 6/2005 | Kurotsuchi et al. |
| 2005/0161747 A1 | 7/2005 | Lung et al. |
| 2005/0174835 A1* | 8/2005 | Rinerson ............... G11C 11/16 365/171 |
| 2005/0205943 A1 | 9/2005 | Yamada |
| 2005/0243844 A1 | 11/2005 | Aono et al. |
| 2005/0250281 A1 | 11/2005 | Ufert et al. |
| 2005/0269646 A1 | 12/2005 | Yamada |
| 2005/0275003 A1 | 12/2005 | Shinmura |
| 2005/0287741 A1 | 12/2005 | Ding |
| 2006/0035451 A1 | 2/2006 | Hsu |
| 2006/0046509 A1 | 3/2006 | Gwan-Hyeob |
| 2006/0062049 A1 | 3/2006 | Lee et al. |
| 2006/0097238 A1 | 5/2006 | Breuil et al. |
| 2006/0099813 A1 | 5/2006 | Pan et al. |
| 2006/0104111 A1 | 5/2006 | Tripsas et al. |
| 2006/0110878 A1 | 5/2006 | Lung et al. |
| 2006/0160304 A1 | 7/2006 | Hsu et al. |
| 2006/0170027 A1 | 8/2006 | Lee et al. |
| 2006/0171200 A1 | 8/2006 | Rinerson et al. |
| 2006/0181920 A1 | 8/2006 | Ufert |
| 2006/0215445 A1 | 9/2006 | Baek et al. |
| 2006/0258079 A1 | 11/2006 | Lung et al. |
| 2006/0258089 A1* | 11/2006 | Chung-Zen ....... H01L 21/28273 438/257 |
| 2006/0274593 A1 | 12/2006 | Kurotsuchi et al. |
| 2006/0284242 A1 | 12/2006 | Jo |
| 2006/0286709 A1 | 12/2006 | Lung et al. |
| 2007/0010082 A1 | 1/2007 | Pinnow et al. |
| 2007/0015330 A1 | 1/2007 | Li et al. |
| 2007/0034848 A1 | 2/2007 | Liu |
| 2007/0045615 A1 | 3/2007 | Cho et al. |
| 2007/0048990 A1 | 3/2007 | Zhuang et al. |
| 2007/0086235 A1 | 4/2007 | Kim et al. |
| 2007/0109835 A1 | 5/2007 | Hsu |
| 2007/0120124 A1 | 5/2007 | Chen et al. |
| 2007/0121369 A1 | 5/2007 | Happ |
| 2007/0123039 A1 | 5/2007 | Elkins et al. |
| 2007/0132049 A1 | 6/2007 | Stipe |
| 2007/0165434 A1 | 7/2007 | Lee et al. |
| 2007/0167008 A1 | 7/2007 | Hsu et al. |
| 2007/0171706 A1* | 7/2007 | Fuji ....................... G11C 5/025 365/163 |
| 2007/0173019 A1 | 7/2007 | Ho et al. |
| 2007/0176261 A1 | 8/2007 | Lung |
| 2007/0210348 A1 | 9/2007 | Song et al. |
| 2007/0224770 A1 | 9/2007 | Nagashima |
| 2007/0231988 A1 | 10/2007 | Yoo et al. |
| 2007/0243659 A1 | 10/2007 | Shin et al. |
| 2007/0246795 A1 | 10/2007 | Fang et al. |
| 2007/0257257 A1 | 11/2007 | Cho et al. |
| 2007/0258279 A1 | 11/2007 | Lung et al. |
| 2007/0267675 A1 | 11/2007 | Cho et al. |
| 2007/0268739 A1 | 11/2007 | Yoo et al. |
| 2007/0268742 A1 | 11/2007 | Liu |
| 2007/0269683 A1 | 11/2007 | Chen et al. |
| 2007/0278578 A1 | 12/2007 | Yoshida et al. |
| 2007/0285965 A1 | 12/2007 | Toda et al. |
| 2007/0295950 A1 | 12/2007 | Cho et al. |
| 2008/0001172 A1 | 1/2008 | Karg et al. |
| 2008/0008642 A1 | 1/2008 | Mori et al. |
| 2008/0012064 A1 | 1/2008 | Park et al. |
| 2008/0013363 A1 | 1/2008 | Kim et al. |
| 2008/0014750 A1 | 1/2008 | Nagashima |
| 2008/0026547 A1 | 1/2008 | Yin et al. |
| 2008/0029754 A1 | 2/2008 | Min et al. |
| 2008/0029842 A1 | 2/2008 | Symanczyk |
| 2008/0036508 A1 | 2/2008 | Sakamoto et al. |
| 2008/0048165 A1 | 2/2008 | Miyazawa |
| 2008/0049487 A1 | 2/2008 | Yoshimura et al. |
| 2008/0062740 A1 | 3/2008 | Baek et al. |
| 2008/0073635 A1 | 3/2008 | Kiyotoshi et al. |
| 2008/0078985 A1 | 4/2008 | Meyer et al. |
| 2008/0080229 A1 | 4/2008 | Choi et al. |
| 2008/0089105 A1 | 4/2008 | Ro et al. |
| 2008/0093591 A1 | 4/2008 | Khang et al. |
| 2008/0099753 A1 | 5/2008 | Song et al. |
| 2008/0102278 A1 | 5/2008 | Kreupl et al. |
| 2008/0105862 A1 | 5/2008 | Lung et al. |
| 2008/0106925 A1 | 5/2008 | Paz De Araujo et al. |
| 2008/0123390 A1 | 5/2008 | Kim et al. |
| 2008/0157257 A1 | 7/2008 | Bertin et al. |
| 2008/0175031 A1 | 7/2008 | Park et al. |
| 2008/0175032 A1 | 7/2008 | Tanaka et al. |
| 2008/0176374 A1 | 7/2008 | Jon et al. |
| 2008/0185571 A1 | 8/2008 | Happ et al. |
| 2008/0185687 A1 | 8/2008 | Hong et al. |
| 2008/0212361 A1 | 9/2008 | Bertin et al. |
| 2008/0232160 A1 | 9/2008 | Gopalakrishnan |
| 2008/0247219 A1 | 10/2008 | Choi et al. |
| 2008/0251779 A1 | 10/2008 | Kakosehke et al. |
| 2008/0258126 A1 | 10/2008 | Lung |
| 2008/0259672 A1 | 10/2008 | Lung |
| 2008/0280390 A1 | 11/2008 | Kim et al. |
| 2008/0303014 A1 | 12/2008 | Goux et al. |
| 2009/0014706 A1 | 1/2009 | Lung |
| 2009/0014707 A1 | 1/2009 | Lu et al. |
| 2009/0026436 A1 | 1/2009 | Song et al. |
| 2009/0057640 A1 | 3/2009 | Lin et al. |
| 2009/0059644 A1 | 3/2009 | Kajigaya et al. |
| 2009/0072217 A1 | 3/2009 | Klostermann |
| 2009/0085121 A1 | 4/2009 | Park et al. |
| 2009/0097295 A1 | 4/2009 | Morimoto |
| 2009/0173930 A1 | 7/2009 | Yasuda et al. |
| 2009/0180309 A1 | 7/2009 | Liu |
| 2009/0207647 A1 | 8/2009 | Maejima et al. |
| 2009/0207681 A1 | 8/2009 | Juengling |
| 2009/0218557 A1 | 9/2009 | Sato |
| 2009/0250681 A1 | 10/2009 | Smythe et al. |
| 2009/0261314 A1* | 10/2009 | Kim et al. ......................... 257/4 |
| 2009/0261343 A1 | 10/2009 | Herner et al. |
| 2009/0267047 A1 | 10/2009 | Sasago et al. |
| 2009/0268532 A1 | 10/2009 | DeAmbroggi et al. |
| 2009/0272959 A1 | 11/2009 | Phatak et al. |
| 2009/0272960 A1 | 11/2009 | Srinivasan et al. |
| 2009/0272961 A1 | 11/2009 | Miller et al. |
| 2009/0272962 A1 | 11/2009 | Kumar et al. |
| 2009/0273087 A1 | 11/2009 | French et al. |
| 2009/0278109 A1 | 11/2009 | Phatak |
| 2009/0280599 A1 | 11/2009 | Im et al. |
| 2009/0303785 A1 | 12/2009 | Kasko et al. |
| 2009/0315090 A1 | 12/2009 | Weis et al. |
| 2009/0316467 A1 | 12/2009 | Liu |
| 2009/0316474 A1 | 12/2009 | Cho et al. |
| 2009/0317540 A1 | 12/2009 | Sandhu et al. |
| 2009/0321878 A1 | 12/2009 | Koo et al. |
| 2009/0323385 A1* | 12/2009 | Scheuerlein et al. ........... 365/51 |
| 2010/0003782 A1 | 1/2010 | Sinha et al. |
| 2010/0008124 A1 | 1/2010 | Scheuerlein et al. |
| 2010/0008163 A1 | 1/2010 | Liu |
| 2010/0044666 A1 | 2/2010 | Baek et al. |
| 2010/0046273 A1 | 2/2010 | Azuma et al. |
| 2010/0065836 A1 | 3/2010 | Lee et al. |
| 2010/0072542 A1 | 3/2010 | Kadoya et al. |
| 2010/0084741 A1 | 4/2010 | Andres |
| 2010/0085798 A1 | 4/2010 | Lu et al. |
| 2010/0090187 A1 | 4/2010 | Ahn et al. |
| 2010/0110759 A1 | 5/2010 | Jin et al. |
| 2010/0112774 A1 | 5/2010 | Oh et al. |
| 2010/0123542 A1 | 5/2010 | Vaithyanathan et al. |
| 2010/0124813 A1 | 5/2010 | Matamis et al. |
| 2010/0129995 A1 | 5/2010 | Im et al. |
| 2010/0135061 A1 | 6/2010 | Li et al. |
| 2010/0140578 A1 | 6/2010 | Tian et al. |
| 2010/0157657 A1 | 6/2010 | Rinerson et al. |
| 2010/0157658 A1 | 6/2010 | Schloss et al. |
| 2010/0163820 A1 | 7/2010 | Son |

(56) References Cited

U.S. PATENT DOCUMENTS

| | | |
|---|---|---|
| 2010/0163829 A1 | 7/2010 | Wang et al. |
| 2010/0172171 A1 | 7/2010 | Azuma et al. |
| 2010/0178729 A1 | 7/2010 | Yoon et al. |
| 2010/0193758 A1 | 8/2010 | Tian et al. |
| 2010/0193761 A1 | 8/2010 | Amin et al. |
| 2010/0193762 A1 | 8/2010 | Hsieh et al. |
| 2010/0195371 A1 | 8/2010 | Ohba et al. |
| 2010/0232200 A1 | 9/2010 | Shepard |
| 2010/0237442 A1 | 9/2010 | Li et al. |
| 2010/0243983 A1 | 9/2010 | Chiang et al. |
| 2010/0258782 A1 | 10/2010 | Kuse et al. |
| 2010/0259960 A1 | 10/2010 | Samachisa |
| 2010/0259962 A1 | 10/2010 | Yan et al. |
| 2011/0018053 A1 | 1/2011 | Lo et al. |
| 2011/0044098 A1 | 2/2011 | An et al. |
| 2011/0059576 A1 | 3/2011 | Cho et al. |
| 2011/0076827 A1 | 3/2011 | Liu et al. |
| 2011/0128775 A1 | 6/2011 | Maejima et al. |
| 2011/0147695 A1 | 6/2011 | Lee et al. |
| 2011/0205783 A1 | 8/2011 | Murooka |
| 2011/0249486 A1 | 10/2011 | Azuma et al. |
| 2011/0309322 A1 | 12/2011 | Hwang |
| 2012/0039116 A1 | 2/2012 | Yoo et al. |
| 2012/0119180 A1 | 5/2012 | Koo et al. |
| 2012/0147648 A1 | 6/2012 | Scheuerlein |
| 2012/0161318 A1 | 6/2012 | Min |
| 2012/0181500 A1 | 7/2012 | Tsuji et al. |
| 2012/0181599 A1 | 7/2012 | Lung |
| 2012/0225534 A1 | 9/2012 | Lee et al. |
| 2012/0248399 A1 | 10/2012 | Sasago et al. |
| 2012/0264272 A1 | 10/2012 | Sills et al. |
| 2012/0282752 A1 | 11/2012 | Lee et al. |
| 2013/0102150 A1 | 4/2013 | Oh et al. |
| 2013/0126816 A1 | 5/2013 | Tang et al. |
| 2015/0280118 A1 | 10/2015 | Lee et al. |

FOREIGN PATENT DOCUMENTS

| | | |
|---|---|---|
| CN | 1459792 | 12/2003 |
| CN | 1624803 | 6/2005 |
| CN | 101005113 | 12/2006 |
| CN | 101051670 | 4/2007 |
| CN | 101034732 | 9/2007 |
| CN | 101256831 | 9/2008 |
| CN | 101350360 | 1/2009 |
| CN | 101546600 2 | 9/2009 |
| CN | 200880124714.6 | 7/2012 |
| CN | 201180027954.6 | 5/2014 |
| CN | 200180065042.8 | 5/2015 |
| CN | 201180057866.0 | 11/2015 |
| EP | GB 1266513 | 3/1972 |
| EP | 1796103 | 9/2006 |
| EP | 11792836 | 12/2013 |
| EP | 11845727.4 | 11/2014 |
| EP | 11834802 | 3/2015 |
| EP | 14171745 | 3/2015 |
| JP | 2005175457 | 6/2005 |
| JP | 2005-353779 | 12/2005 |
| JP | 2006032729 | 2/2006 |
| JP | 2006040981 | 2/2006 |
| JP | 2006074028 | 3/2006 |
| JP | 2006121044 | 5/2006 |
| JP | 2008-135744 | 6/2008 |
| JP | 2008-192995 | 8/2008 |
| JP | 2009-081251 | 4/2009 |
| JP | 2009-163867 | 7/2009 |
| JP | 2009-267411 | 11/2009 |
| JP | 2010-009669 | 1/2010 |
| JP | 2010-010688 | 1/2010 |
| JP | 2010-192569 | 9/2010 |
| JP | 2010-192646 | 9/2010 |
| JP | 2010-232214 | 10/2010 |
| JP | 2010-263211 | 11/2010 |
| KR | 2005-0008353 | 1/2005 |
| KR | 2006-0050833 | 5/2006 |
| KR | 1020060087882 | 8/2006 |
| KR | 10-0751736 | 8/2007 |
| KR | 20070111840 | 11/2007 |
| KR | 20070118865 | 12/2007 |
| KR | 20090109804 | 10/2009 |
| KR | 2010-0078808 | 7/2010 |
| KR | 20100083402 | 7/2010 |
| KR | 2011-0015000 | 2/2011 |
| TW | 097147549 | 5/2013 |
| TW | 100119681 | 8/2013 |
| TW | 10135681 | 10/2013 |
| WO | WO 2006/003620 | 1/2006 |
| WO | WO 2008/029446 | 3/2008 |
| WO | WO PCT/US2008/084422 | 3/2009 |
| WO | WO 2009/127187 | 10/2009 |
| WO | WO 2010/068221 | 6/2010 |
| WO | WO 2010/082922 | 7/2010 |
| WO | WO 2010/082923 | 7/2010 |
| WO | WO 2010/082928 | 7/2010 |
| WO | WO 2010/085241 | 7/2010 |
| WO | WO PCT/US2008/084422 | 7/2010 |
| WO | WO 2010/087854 | 8/2010 |
| WO | WO 2010/101340 | 9/2010 |
| WO | WO 2010/117911 | 10/2010 |
| WO | WO PCT/US2011/059095 | 6/2011 |
| WO | WO PCT/US2011/035601 | 11/2011 |
| WO | WO PCT/US2011/051785 | 4/2012 |
| WO | WO PCT/US2011/059095 | 5/2012 |
| WO | WO PCT/US2012/021168 | 7/2012 |
| WO | WO PCT/US2011/066770 | 9/2012 |
| WO | WO PCT/US2011/035601 | 12/2012 |
| WO | WO PCT/US2011/051785 | 4/2013 |
| WO | WO PCT/US2011/066770 | 7/2013 |
| WO | WO PCT/US2013/069009 | 11/2013 |
| WO | WO PCT/US2013/069009 | 5/2015 |

OTHER PUBLICATIONS

U.S. Appl. No. 12/765,598, filed Apr. 22, 2010, Sandhu et al.
U.S. Appl. No. 12/765,606, filed Apr. 22, 2010, Tang et al.
Baek et al., "Multi-Layer cross-point Binary Oxide resistive Memory (OxRRAM) for Post-NAND Storage Application", IEEE, 2005.
Bedeschi et al., "A Bipolar-Selected Phase Change Memory Featuring Multi-Level Cell Storage", IEEE, vol. 44, No. 1, Jan. 2009, pp. 217-227.
Chen et al., "Non-Volatile Resistive Switching for Advanced Memory Applications", IEEE, 2005, 4 pages.
Chen et al., "Peroskite RRAM Devices wtih Metal/Insulator/PCMO/Metal Heterostructures", 2005; pp. 125-128.
Choi et al., "Defect Structure and Electrical Properties of single-Crystal Ba0.03SR0.97TiO3", J. Am Ceram. Soc., 71, [4], pp. 201-205, 1988.
Courtade et al., "Microstructure and resistance switching in NiO binary oxide films obtained from Ni oxidation", IEEE, 2006, pp. 94-99.
Ho et al., "A Highly Reliable Self-=Aligned Graded Oxide WOx Resistance Memory: Conduction Mechanisms and Reliability", 2007 Symposium on VLSI Technology Digest of Technical Papers, pp. 228-229.
Hosoi et al., "High Speed Unipolar Switching Resistance RAM (RRAM) Technology".

(56) References Cited

OTHER PUBLICATIONS

Hudgens et al., "Overview of Phase-Change Chalcogenide Non-volatile Memory Technology", MRS Bulletin, Nov. 2004, pp. 829-832.
Ignatiev et al., "Resistance Non-volatile Memory-RRAM", Mater. Res. Soc. Symp. Proc., vol. 997, 2007, Materials Research Society, 9 pages.
Karg et al., "Nanoscale REsistive Memory Device using SrRiO3 Films", IEEE, 2007, pp. 68-70.
Kau et al., "A Stackable cross point phase change memory", IEEE, 2009, pp. 27.1.1-27.1.4.
Komori et al., Disturbless flash memory due to high boost efficiency on BiCS structure and optimal memory film stack for ultra high density storage device; Dec. 2008; pp. 851-854.
Kozicki et al., "Non-Volatile Memory Based on Solid Electrolytes", Center for Solid State Electronics Research, Arizona State University, 8 pages.
Kozicki, "Memory Devices Based on Solid Electrolytes", Mater. Res. Soc. Symp. Proc., vol. 997, 2007, Materials Research Society, 10 pages.
Lee et al., "2-stack 1D-1R Cross-Point Structure with Oxide Diodes as Switch Elements for High Density Resistance RAM Applications", IEE, 2007, pp. 771-774.
Lee et al., "Resistance Switching of Al doped ZnO for Non-Volatile Memory Applications", Dept. of Materials Science and Engineering, Gwangju Institute of Science and Technology, 2 pages.
Lin et al., "Effect of Top Electrode Material on REsistive Switching Properties of ZrO2 Film Memory Devices", IEEE, May 2007, vol. 28, No. 5, pp. 366-368.
Meyer et al., "Oxide Dual-Layer Memory Element for Scalable Non-Volatile Cross-Point Memory Technology", IEEE, 2008, 5 pages.
Miyashita et al., "A Novel Bit-Line Process using Poly-Si Masked Dual-Damascene (PMDD) for 0.13 um DRAMs and Beyond", IEEE, 2000, pp. 15.4.1-15.4.4.
Muller et al., "Emerging Non-Volatile Memory Technologies", IEEE, 2003, pp. 37-44.
Oh, "Full Integration of Highly Manufacturable 512Mb PRAM based on 90nm Technology" 2006, IEEE, 4 pages.
Pein et al., "Performance of the 3-D Pencil Flash EPROM Cell and Memory Array", IEEE, 1995, pp. 1982-1991.
Pellizzer et al., "A 90nm Phase Change Memory Technology for Stand-Alone Non-Volatile Memory Applications", IEEE, 2006, Symposium on VLSI Technology Digest of Technical Papers, 2 pages.
Pirovano et al., "Self-Aligned u Trench Phase-Change Memory Cell Architecture for 90nm Technology and Beyond", IEEE, 2007, pp. 222-225.
Website, http://en.wikipedia.org/wiki/Programmable_metallization_cell, 4 pages.
Wuttig, "Towards a Universal Memory?", Nature Materials, vol. 4, Apr. 2005, pp. 265-266.
Yoon et al., "Vertical Cross-Point Resistance Change Memory for Ultra-High Density Non-volatile Memory Applications", 2009 Symposium on VLSI Technology Digest of Technical Papers, pp. 26-27.
Yu et al., "Structure Effects on Resistive Switching of Al/TiOx/Al Devices for RRAM Applications", IEEE, 2008, pp. 331-333.
Higaki et al., "Effects of Gas Phase Absorption into Si Substrates on Plasma doping Process" A208.
Kooij et al., "Photoselective Metal Deposition on Amorphous Silicon p-i-n Solar Cells", Electrochemical Society Letters, Journal of Electrochemical Society vol. 44, No. 10, Oct. 1997, pp. L271-L272.
Programmable metallization cell, Dec. 11, 2007; http://en.wikipedia.org/wiki/Programmable_metallization_cell on Dec. 13, 2011.
Scheck et al., "Selective Metal Electrodeposition Through Doping Modulation of Semiconductor Surfaces". Applied Physics Letters 86, 2005, 3 pgs.
Yih et al., "SiC/Si Heterojunction Diodes Fabricated by Self-Selective and by Blanket Rapid Thermal Chemical Vapor Deposition", IEEE vol. 41 No. 3, Mar. 1994, pp. 281-287.
U.S. Appl. No. 12/979,189, filed Dec. 27, 2010, Sills et al.
U.S. Appl. No. 13/010,048, filed Jan. 20, 2011, Liu et al.
Xing et al., "Characterization of AlGaN/GaN p-n Diodes with Selectively Regrown n-AlGaN by Metal-Organic Chemical-Vapor Deposition and its Application to GaN-Based Bipolar Transistors", Journal of Allpied Physics 97, 2005, 4 pgs.
Raoux et al., "Phase-change random access memory: A scalable technology", IBM J. Res & Dev, vol. 52, No. 4/5, pp. 465-479 (Jul./Sep. 2008).

\* cited by examiner

ARRAY OF NONVOLATILE MEMORY CELLS HAVING AT LEAST FIVE MEMORY CELLS PER UNIT CELL, HAVING A PLURALITY OF THE UNIT CELLS WHICH INDIVIDUALLY COMPRISE THREE ELEVATIONAL REGIONS OF PROGRAMMABLE MATERIAL, AND/OR HAVING A CONTINUOUS VOLUME HAVING A COMBINATION OF A PLURALITY OF VERTICALLY ORIENTED MEMORY CELLS AND A PLURALITY OF HORIZONTALLY ORIENTED MEMORY CELLS; ARRAY OF VERTICALLY STACKED TIERS OF NONVOLATILE MEMORY CELLS

TECHNICAL FIELD

Embodiments disclosed herein pertain to arrays of nonvolatile memory cells.

BACKGROUND

Memory is one type of integrated circuitry, and is used in computer systems for storing data. Such is usually fabricated in one or more arrays of individual memory cells. The memory cells might be volatile, semi-volatile, or nonvolatile. Nonvolatile memory cells can store data for extended periods of time, in many instances including when the computer is turned off. Volatile memory dissipates and therefore requires being refreshed/rewritten, in many instances multiple times per second. Regardless, the smallest unit in each array is termed as a memory cell and is configured to retain or store memory in at least two different selectable states. In a binary system, the states are considered as either a "0" or a "1". In other systems, at least some individual memory cells may be configured to store more than two levels or states of information.

Integrated circuitry fabrication continues to strive to produce smaller and denser integrated circuits. Accordingly, the fewer components an individual circuit device has, the smaller the construction of the finished device can be. Likely the smallest and simplest memory cell will be comprised of two current conductive electrodes having a programmable material received there-between. The programmable material is selected or designed to be configured in a selected one of at least two different resistive states to enable storing of information by an individual memory cell. The reading of the cell comprises determination of which of the states the programmable material is in, and the writing of information to the cell comprises placing the programmable material in a predetermined resistive state. Some programmable materials retain a resistive state in the absence of refresh, and thus may be incorporated into nonvolatile memory cells.

Some programmable materials may contain mobile charge carriers larger than electrons and holes, for example ions in some example applications. Regardless, the programmable materials may be converted from one memory state to another by moving the mobile charge carriers therein to alter a distribution of charge density within the programmable materials. Some example memory devices that utilize ions as mobile charge carriers are resistive RAM (RRAM) cells, which can include classes of memory cells containing multivalent oxides, and which can include memristors in some specific applications. Other example memory devices that utilize ions as charge carriers are programmable metallization cells (PMCs); which may be alternatively referred to as a conductive bridging RAM (CBRAM), nanobridge memory, or electrolyte memory.

The RRAM cells may contain programmable material sandwiched between a pair of electrodes. The programming of the RRAM cells may comprise transitioning the programmable material between first a memory state in which charge density is relatively uniformly dispersed throughout the material and a second memory state in which the charge density is concentrated in a specific region of the material (for instance, a region closer to one electrode than the other).

A PMC may similarly have programmable material sandwiched between a pair of current conductive electrodes. The PMC programmable material comprises ion conductive material, for example a suitable chalcogenide or any of various suitable oxides. A suitable voltage applied across the electrodes generates current conductive super-ionic clusters or filaments. Such result from ion transport through the ion conductive material which grows the clusters/filaments from one of the electrodes (the cathode), through the ion conductive material, and toward the other electrode (the anode). The clusters or filaments create current conductive paths between the electrodes. An opposite voltage applied across the electrodes essentially reverses the process and thus removes the current conductive paths. A PMC thus comprises a high resistance state (corresponding to the state lacking a current conductive filament or clusters between the electrodes) and a low resistance state (corresponding to the state having a current conductive filament or clusters between the electrodes), with such states being reversibly interchangeable with one another.

DETAILED DESCRIPTION OF EXAMPLE EMBODIMENTS

Figure 1:
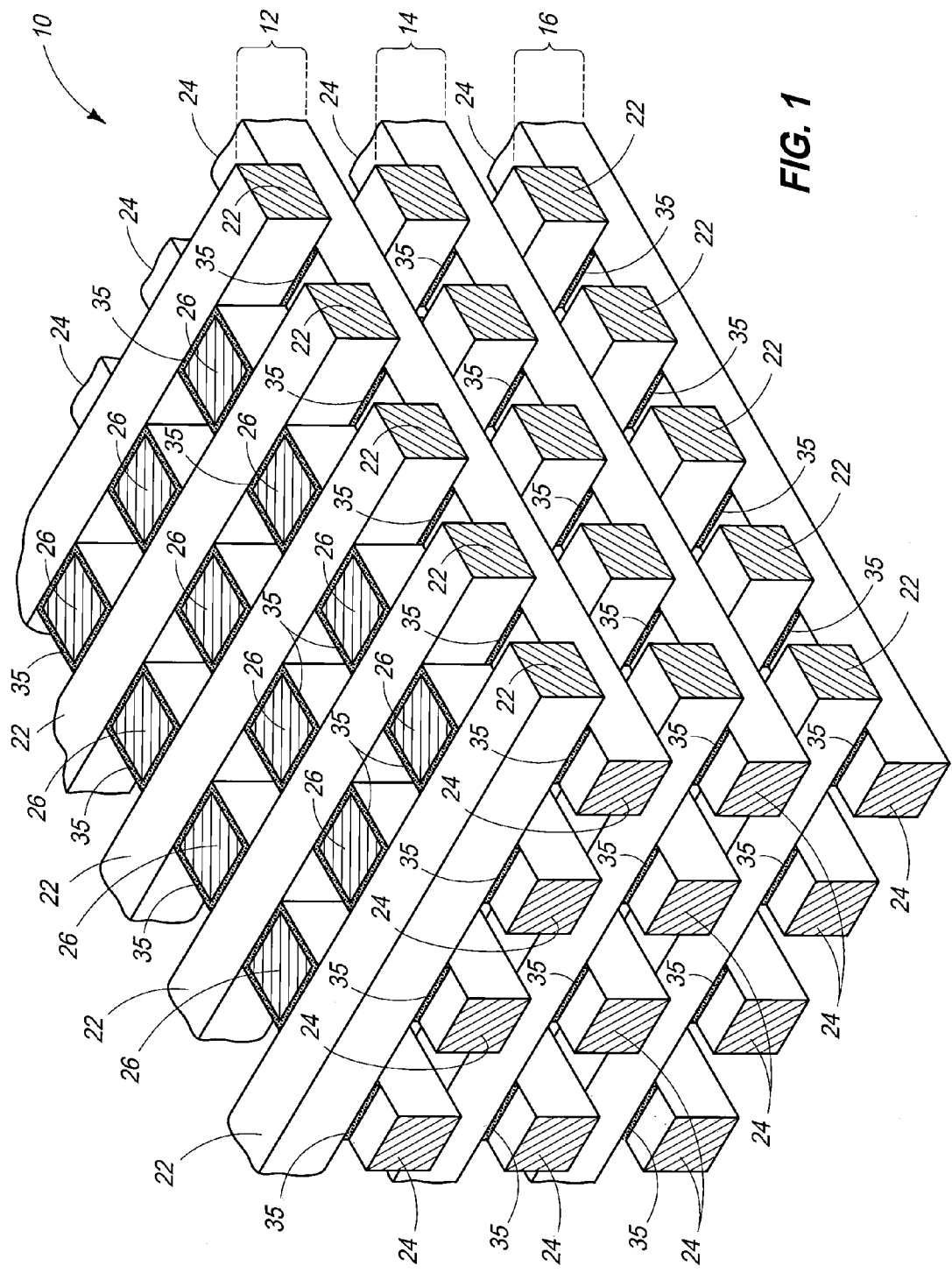
FIG. 1 is a diagrammatic isometric view of an array of nonvolatile memory cells in accordance with an embodiment of the invention.
Figure 2:
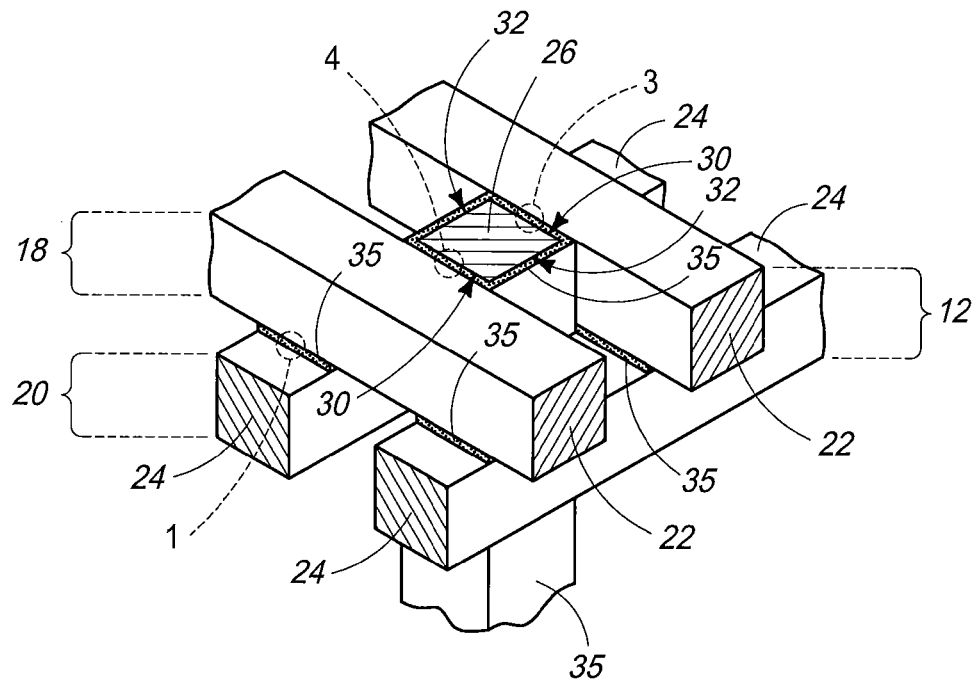
FIG. 2 is a fragmentary view of a portion of the array of FIG. 1.

Embodiments of the invention include arrays of nonvolatile memory cells. Some example embodiments are initially described with reference to FIGS. 1-5 of an array 10 of vertically stacked tiers of such memory cells. FIG. 1 shows a portion of an array area within which a plurality of nonvolatile memory cells has been fabricated. Logic circuitry (not shown) would typically be fabricated outside of the array area. Control and/or other peripheral circuitry (not shown) for operating the memory array may or may not fully or partially be received within the array area, with an example array area as a minimum encompassing all of the memory cells of a given array/sub-array. Further, multiple sub-arrays might also be fabricated and operated independently, in tandem, or otherwise relative one another. As used in this document, a "sub-array" may also be considered as an array.

FIG. 1 depicts three vertically stacked tiers 12, 14, 16 of memory cells. More or fewer tiers may be used. Accordingly, one or more tiers may be received elevationally outward of tier 12 and/or elevationally inward of tier 16. Regardless, array 10 would be fabricated relative to a suitable base substrate (not shown) which may be homogenous or non-homogenous, for example comprising multiple different composition materials and/or layers. As an example, such may comprise bulk monocrystalline silicon and/or a semiconductor-on-insulator substrate. As an additional example, such may comprise dielectric material having conductive contacts or vias formed therein which extend vertically or otherwise into current conductive electrical connection with electronic device components, regions, or material received elevationally inward of the dielectric material. In this document, vertical is a direction generally orthogonal to a primary surface relative to which the substrate is processed during fabrication and which may considered to define a generally horizontal direction. Further, "vertical" and "horizontal" as used herein are generally perpendicular directions relative one another independent of orientation of the substrate in three dimensional space. Further in this document, "elevational" and "elevationally" are with reference to the vertical direction from a base substrate upon which the circuitry is fabricated. The base substrate may or may not be a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. The array structure of FIG. 1 would likely be encompassed within/encapsulated by dielectric material which is not shown in any of the figures for clarity of operative memory cell components within the array.

Figure 3:
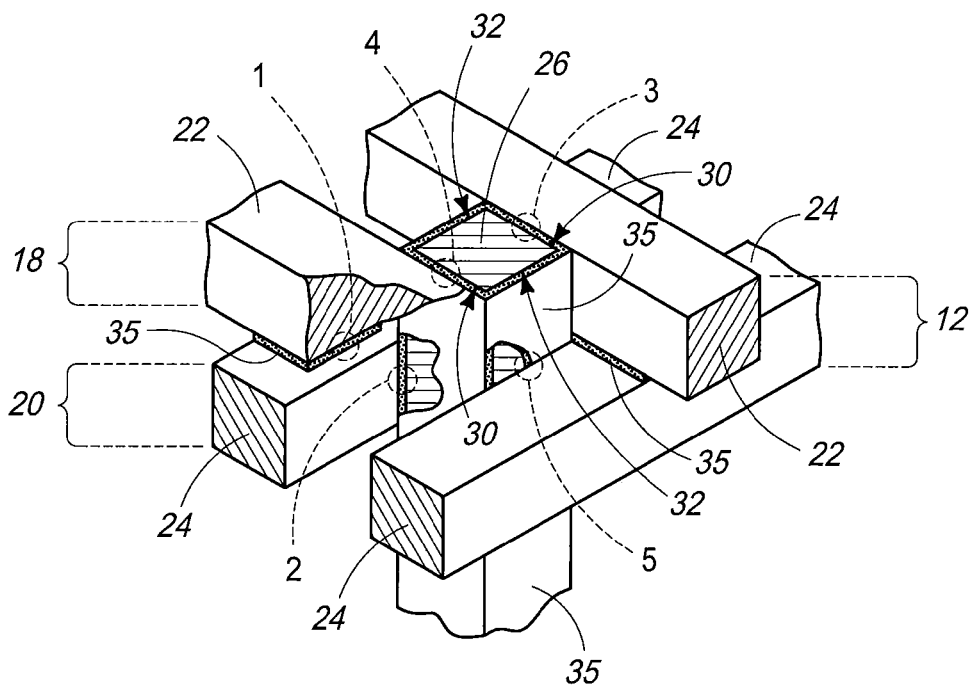
FIG. 3 is a fragmentary view of FIG. 2.
Figure 4:
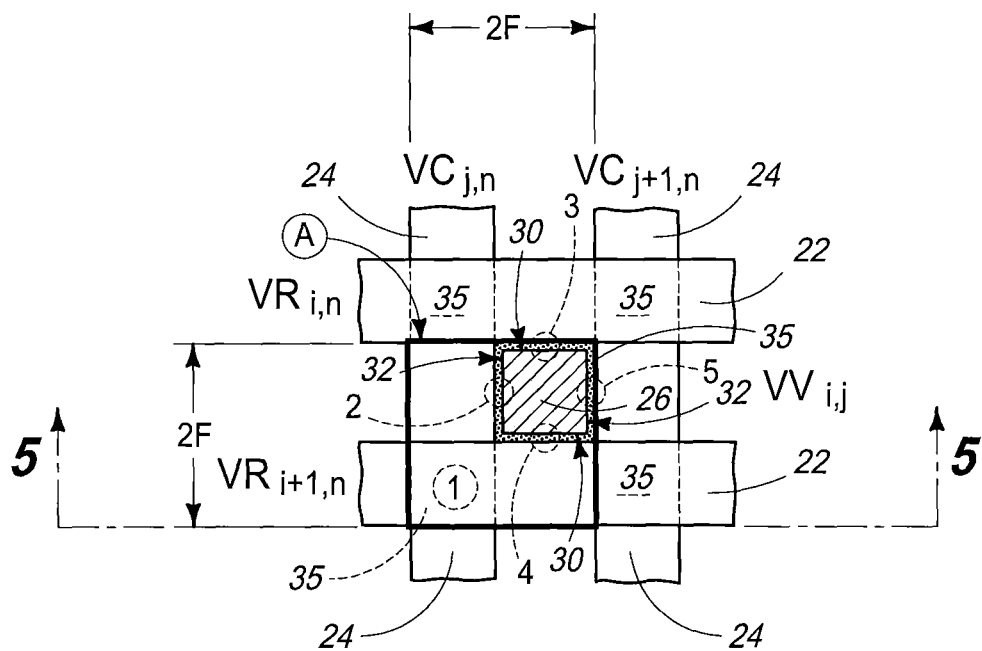
FIG. 4 is a top view of FIG. 2.
Figure 5:
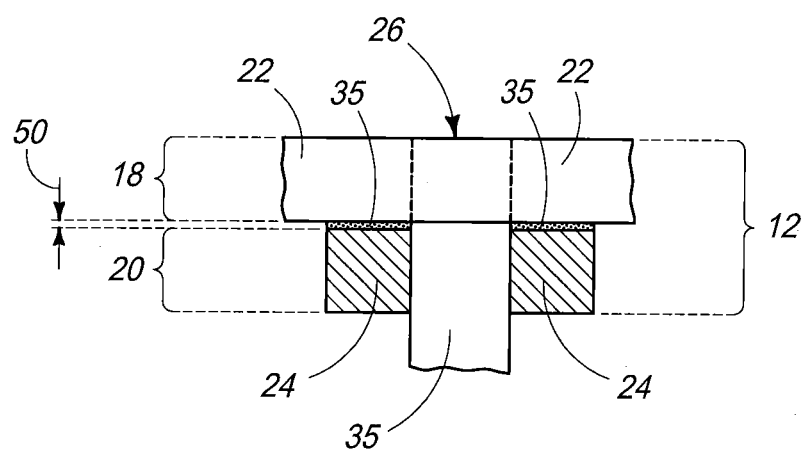
FIG. 5 is a sectional view taken through line 5-5 in FIG. 4.

Vertical tiers 12, 14, 16 may be of the same or different respective construction(s). In one embodiment, all of such are of the same construction, for example to achieve an ultimate highest density and/or for ease in fabrication. Regardless, at least some of the individual vertical tiers may be characterized by certain attributes example embodiments of which are initially described with reference to FIGS. 1-5. FIGS. 2-5 are views of the same portion of FIG. 1 which may be considered as a region of interest with respect to some embodiments of the invention. Only a portion of tier 12 is shown in FIGS. 2-5, and components of the immediately lower adjacent tier 14 are not shown for clarity. In one embodiment, FIGS. 2-5 may be considered as comprising a continuous volume of the array 10 of FIG. 1, and in one embodiment may be considered as depicting or encompassing an isometric view of a "unit cell" of array 12 which is described below. Regardless, FIG. 5 is an elevational end-view looking from the left and straight onto FIG. 2, whereas FIG. 4 is a top-down view of FIG. 2. FIG. 3 is a partial and fragmentary partial view of FIG. 2.

Individual vertical tiers comprise an elevationally outer tier 18 (FIGS. 2, 3, and 5) and an elevationally inner tier 20 of respective pluralities of horizontally oriented first electrode lines. Specifically, outer tier 18 has first electrode lines 22 and inner tier 20 has first electrode lines 24. First electrode lines 22 of outer tier 18 cross with respect to first electrode lines 24 of inner tier 20, and in one embodiment at about 90°.

A plurality of vertically oriented second electrode lines 26 extends through inner tier 20 and outer tier 18. Individual of vertically oriented second electrode lines 26 extend between immediately adjacent respective pairs of the first electrode lines in the inner tier and in the outer tier. For example in FIGS. 2-5, the illustrated second electrode line 26 extends between the depicted immediately adjacent pair of first electrode lines 22 of outer tier 18 and extends between the depicted immediately adjacent pair of first electrode lines 24 of inner tier 20. Vertically oriented second electrode lines 26 also extend elevationally inward and outward through other of the vertically stacked tiers of nonvolatile memory cells. Vertically oriented second electrode lines 26 may be considered as having a first pair of opposing lateral sides 30 and a second pair of opposing lateral sides 32. In one embodiment and as shown, first pair of opposing lateral sides 30 and second pair of opposing lateral sides 32 are oriented at about 90° relative one another. In one embodiment, the first electrode lines are data/sense lines and the second electrode lines are access lines.

The first and second electrode lines comprise current conductive material, may be homogenous or non-homogenous, and may be of the same composition or of different compositions. In the context of this document, "current conductive material" is a composition where electric current flow would inherently occur therein predominantly by movement of subatomic positive and/or negative charges when such are generated as opposed to predominantly by movement of ions. Example current conductive materials are elemental metals, alloys of elemental metals, current conductive metal compounds, and conductively doped semiconductive material, including any combinations thereof.

Programmable material 35 is received between each of one of the pairs of opposing lateral sides of second electrode line 26 and one of the first electrode lines of one of the inner and outer tiers. Programmable material is also received between each of the other pair of opposing lateral sides of second electrode line 26 and the first electrode lines of the other of the inner and outer tiers. In FIGS. 1-5, example programmable material 35 is received between each of lateral sides 30 and different adjacent first electrode lines 22 in outer tier 18, and also between each of lateral sides 32 and different adjacent first electrode lines 24 in inner tier 20. Programmable material 35 may entirely circumferentially encircle individual vertically oriented second electrode lines 26 within one or both of the inner and outer tiers, with full encircling being shown with respect to both such tiers 18 and 20 in the example embodiments of FIGS. 1-5. In one embodiment and as shown, programmable material 35 is also received between individual first electrode lines 22 of outer tier 18 and individual first electrode lines 24 of inner tier 20 where such cross.

Regardless, programmable material 35 may be solid, gel, amorphous, crystalline, or any other suitable phase, and may be homogenous or non-homogenous. Any existing or yet-to-be developed programmable material may be used, with only some examples being provided below.

One example programmable material is ion conductive material. Example suitable such materials comprise chalcogenide-type (for instance, materials comprising one or more of germanium, selenium, antimony, tellurium, sulfur, copper, etc.; with example chalcogenide-type materials being $Ge_2Sb_2Te_5$, $GeS_2$, $GeSe_2$, $CuS_2$, and $CuTe$) and/or oxides such as zirconium oxide, hafnium oxide, tungsten oxide, copper oxide, niobium oxide, iron oxide, silicon oxide (specifically, silicon dioxide), gadolinium oxide, etc. capable of inherently (or with additive) supporting electrolyte behavior. Such may have silver, copper, cobalt, and/or nickel ions, and/or other suitable ions, diffused therein for ionic conduction, analogously to structures disclosed in U.S. Pat. No. 7,405,967 and U.S. Patent Publication Number 2010/0193758.

Additional example programmable materials include multi-resistive state metal oxide-comprising material. Such may comprise, for example, at least two different layers or regions generally regarded as or understood to be active or passive regions, although not necessarily. Alternately, such may only comprise active material. Example active cell region compositions which comprise metal oxide and can be configured in multi-resistive states include one or a combination of $Sr_xRu_yO_z$, $Ru_xO_y$, and $In_xSn_yO_z$. Other examples include MgO, $Ta_2O_5$, $SrTiO_3$, $SrZrO_3$, $BaTiO_3$, $Ba_{(1-x)}Sr_x$-$TiO_3$, $ZrO_x$ (perhaps doped with La), and $CaMnO_3$ (doped with one or more of Pr, La, Sr, or Sm). Example passive cell region compositions include one or a combination of $Al_2O_3$, $TiO_2$, and $HfO_2$. Regardless, a programmable material composite might comprise additional metal oxide or other materials not comprising metal oxide. Example materials and constructions for a multi-resistive state region comprising one or more layers including a programmable metal oxide-comprising material are described and disclosed in U.S. Pat. Nos. 6,753,561; 7,149,108; 7,067,862; and 7,187,201, as well as in U.S. Patent Application Publication Nos. 2006/0171200 and 2007/0173019. Further as is conventional, multi-resistive state metal oxide-comprising materials encompass filament-type metal oxides, ferroelectric metal oxides and others, and whether existing or yet-to-be developed, as long as resistance of the metal oxide-comprising material can be selectively changed.

The programmable material may comprise memristive material. As an example, such material may be statically programmable semiconductive material which comprises mobile dopants that are received within a dielectric such that the material is statically programmable between at least two different resistance states. At least one of the states includes localization or gathering of the mobile dopants such that a dielectric region is formed and thereby provides a higher resistance state. Further, more than two programmable resistance states may be used. In the context of this document, a "mobile dopant" is a component (other than a free electron) of the semiconductive material that is movable to different locations within said dielectric during normal device operation of repeatedly programming the device between at least two different static states by application of voltage differential to the pair of electrodes. Examples include atom vacancies in an otherwise stoichiometric material, and atom interstitials. Specific example mobile dopants include oxygen atom vacancies in amorphous or crystalline oxides or other oxygen-containing material, nitrogen atom vacancies in amorphous or crystalline nitrides or other nitrogen-containing material, fluorine atom vacancies in amorphous or crystalline fluorides or other fluorine-containing material, and interstitial metal atoms in amorphous or crystalline oxides. More than one type of mobile dopant may be used. Example dielectrics in which the mobile dopants are received include suitable oxides, nitrides, and/or fluorides that are capable of localized electrical conductivity based upon sufficiently high quantity and concentration of the mobile dopants. The dielectric within which the mobile dopants are received may or may not be homogenous independent of consideration of the mobile dopants. Specific example dielectrics include $TiO_2$, AlN, and/or $MgF_2$. Example programmable materials that comprise oxygen vacancies as mobile dopants may comprise a combination of $TiO_2$ and $TiO_2$, in at least one programmed resistance state depending on location of the oxygen vacancies and the quantity of the oxygen vacancies in the locations where such are received. An example programmable material that comprises nitrogen vacancies as mobile dopants is a combination of AlN and $AlN_{1-x}$ in at least one programmed state depending on location of the nitrogen vacancies and the quantity of the nitrogen vacancies in the locations where such are received. An example programmable material that comprises fluorine vacancies as mobile dopants may is a combination of $MgF_2$ and $MgF_{2-x}$ in at least one programmed resistance state depending on location of the fluorine vacancies and the quantity of the fluorine vacancies in the locations where such are received. As another example, the mobile dopants may comprise aluminum atom interstitials in a nitrogen-containing material.

Still other example programmable materials include polymer materials such as Bengala Rose, $AlQ_3Ag$, Cu-TCNQ, DDQ, TAPA, and fluorescine-based polymers.

The programmable material, as well as other materials disclosed herein, may be deposited by any existing or yet-to-be-developed technique(s). Examples include vapor phase deposition (i.e., chemical vapor phase deposition, atomic layer deposition, and/or physical vapor deposition) and/or liquid phase deposition, either of which may be selective or non-selective to one or more underlying materials. In example liquid-phase depositions, surface mediated transport (capillarity) and or electrokinetic flow may occur. Wetting agents, surfactants, or other surface modification agents may or may not be used. Further and regardless of deposition method, any deposited material may be subsequently treated, for example annealed or irradiated.

The embodiments of FIGS. 1-5 depict programmable material 35 as being received directly against each of the conductive lines between which such is received. In this document, a material or structure is "directly against" another when there is at least some physical touching contact of the stated materials or structures relative one another. In contrast, "over" encompasses "directly against" as well as constructions where intervening material(s) or structure(s) result(s) in no physical touching contact of the stated materials or structures relative one another. Alternately, one or more additional materials, such as one or more select devices, may be received between the programmable material and one or both of such crossing lines. Any existing or yet-to-be-developed select device may be used, with transistors and diodes being but two examples.

Immediately adjacent electrode lines may be spaced from one another to prevent permanent shorting of two such adjacent lines relative to one another, for example by a programmable material 35 and/or by dielectric material. In one embodiment, the first electrode lines of the outer tier are everywhere elevationally spaced from the first electrode lines of the inner tier within the array. In one embodiment, such separation occurs at least in part by programmable material 35 being elevationally between individual first electrode lines 22 of outer tier 18 and individual first electrode lines 24 of inner tier 20 where such cross.

An embodiment of the invention comprises an array of vertically stacked tiers of nonvolatile memory cells comprising five memory cells occupying a continuous horizontal area of $4F^2$ within an individual of the tiers. The embodiment of FIGS. 1-5 is but one example such embodiment. In this document, "F" is the minimum lateral feature dimension of the smallest feature that is formed using feature edges of a mask pattern that is received outwardly of material from which such smallest features are formed. For example, FIG. 4 diagrammatically depicts a continuous horizontal area "A" comprised of a bold-lined square which is 2F on each side, thereby having an area of $4F^2$. Minimum feature width "F" in the FIG. 4 example is characterized by the depicted individual line width of first electrode lines 22 and the width of a space between immediately adjacent such lines. In this particular example, the depicted minimum line width and minimum space width are equal to one another, and are F. Individual memory cells comprise immediately overlapping adjacent electrode lines having programmable material 35 there-between, with five such memory cells within area A in FIGS. 2-4 being designated as individual memory cells 1, 2, 3, 4, and 5 as small dashed circles. Circles 1, 2, 3, 4, and 5 are small for clarity in the drawings, with the memory cells of course encompassing as a minimum all of the surface area of the facing respective electrodes having programmable material 35 there-between.

An embodiment of the invention includes an array of vertically stacked tiers of nonvolatile memory cells which comprises some continuous volume having a combination of a plurality of vertically oriented memory cells and a plurality of horizontally oriented memory cells. In the context of this document, a vertically oriented memory cell is characterized by predominant current flow through the programmable material in the horizontal direction. Further in the context of this document, a horizontally oriented memory cell is characterized by predominant current flow through the programmable material in the vertical direction. Historically, horizontal cross point memory cells are so named because their opposing electrodes are typically horizontally oriented yet vertically opposing one another. Vertical cross point memory cells were historically so named as their opposing electrodes were laterally oriented relative one another, with one of the electrodes being elongated and running in the vertical direction. However in the context of this document, reference to vertical or horizontal orientation of a memory cell is only relative to predominant current flow through the programmable material regardless of orientation of the electrodes. Regardless, in one embodiment, the continuous volume has a combination of entirely vertically oriented memory cells and entirely horizontally oriented memory cells. In the context of this document, a memory cell is entirely vertically oriented if all current flow to, from, and between the electrodes is in the horizontal direction. Further in the context of this document, a memory cell is entirely horizontally oriented if all current flow to, from, and between the electrodes is in the vertical direction.

The embodiment of FIGS. 1-5 is but one example embodiment having a combination of vertically oriented memory cells and horizontally oriented memory cells. For example, memory cells 1 within the array are horizontally oriented memory cells, whereas memory cells 2, 3, 4, and 5 are vertically oriented memory cells. Further, memory cell 1 is entirely horizontally oriented, and memory cells 2, 3, 4, and 5 are entirely vertically oriented. Regardless, in one embodiment, the array comprises more vertically oriented memory cells than horizontally oriented memory cells. In one embodiment, there is one horizontally oriented memory cell for every four vertically oriented memory cells. In one embodiment, all of the array comprises a combination of vertically oriented memory cells and horizontally oriented memory cells as opposed to just some continuous volume thereof. The depicted and described embodiments of FIGS. 1-5 are but one example array having each of these just-stated attributes.

In one embodiment, an array of nonvolatile memory cells comprises five memory cells per unit cell. In the context of this document, a "unit cell" is the simplest polyhedron that embodies all structural characteristics of, and by three-dimensional repetition makes up, a lattice of the array. Consider, for example, FIGS. 4, 6 and 7. FIG. 4 depicts a horizontal area defined by 2F by 2F sides. Translating such area inwardly within memory cell tier 12 to the base of first electrode lines 24 in lower tier 20 results in a unit cell 40 in FIGS. 6 and 7 of the array 10 of FIG. 1. For clarity, unit cell 40 is shown as being empty in FIG. 6 and as containing memory cell components 22, 24, 26, and 35 in FIG. 7.

Figure 6:
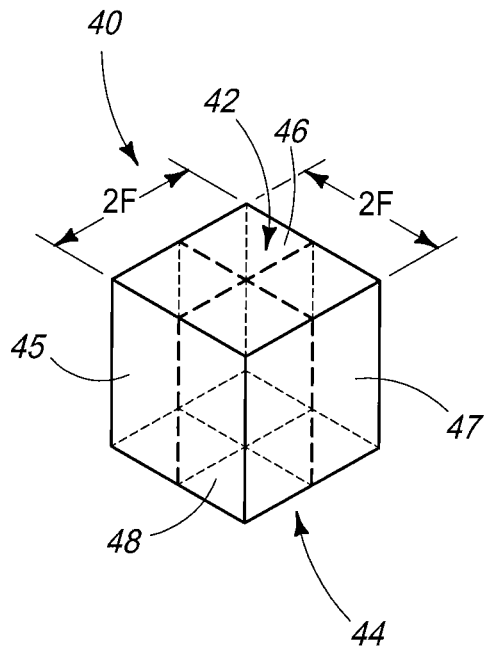
FIG. 6 is a diagrammatic isometric view of an empty unit cell used to characterize some embodiments of the invention.

FIGS. 1-7 depict an embodiment wherein unit cell 40 is a hexahedron which may or may not be a cube, and is not a perfect cube in the depicted embodiment. FIGS. 1-7 also depict an embodiment where there are five and only five memory cells per unit cell 40. Nevertheless and regardless, unit cell 40 in the form of a hexahedron in one embodiment may be considered as having two opposing faces 42, 44 and four corner volumes 45, 46, 47 and 48 extending between opposing faces 42 and 44. (FIG. 6). In one embodiment, programmable material for four of the memory cells extends from one or the other of such opposing faces to inside the hexahedron within a single of the four corner volumes. For example with respect to FIG. 7, corner volume 46 constitutes such a single corner volume for and within which programmable material 35 of memory cells 2, 3, 4, and 5 is received. In one embodiment, programmable material of another memory cell other than the four is received within the corner volume of the hexahedron that is diagonally opposite the single corner volume. For example in FIG. 7, memory cell 1 constitutes such an example another memory cell within corner volume 48 which is diagonally opposite corner volume 46.

Figure 7:
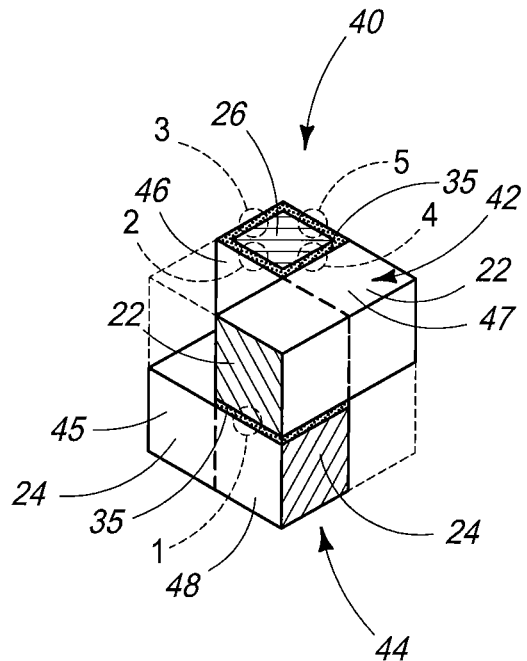
FIG. 7 is a diagrammatic isometric view of a unit cell of the array of FIG. 1 in accordance with some embodiments of the invention.

An embodiment of the invention encompasses an array of nonvolatile memory cells comprising a plurality of unit cells which individually comprise three elevational regions of programmable material. Such regions comprise the programmable material of at least three different memory cells of a unit cell. In one embodiment, the three regions comprise the programmable material of at least four different memory cells of the unit cell, and in one embodiment comprise the programmable material of five different memory cells. The above-described embodiment of FIGS. 1-7 is but one example embodiment having each of these just-stated attributes. For example, consider FIG. 5 as showing three elevational regions 18, 50, 20 with respect to a single unit cell 40 as represented by FIGS. 6 and 7. Each of such regions comprises programmable material 35 of at least three different memory cells of the unit cell. In other words, at least one different memory cell is included in each of the three regions. For example, elevational region 18 comprises programmable material of memory cells 3 and 4, elevational region 20 comprises programmable material of memory cells 2 and 5, and elevational region 50 comprises programmable material of memory cell 1.

In one embodiment, the elevational regions extend laterally parallel one another within individual of the unit cells, with FIGS. 1-7 depicting one such example. Such also depicts an embodiment wherein the elevational regions are of constant respective elevational thickness within each of the unit cells. In the depicted examples, the collective elevational regions are of at least two different elevational thicknesses wherein, for example, the elevational thickness of region 18 is the same as that of region 20. Such also constitutes an example embodiment wherein an elevationally outermost of the three regions (18) and an elevationally innermost of the three regions (20) are of the same thickness within individual of the unit cells, and wherein each of such are thicker than a middle region (50) sandwiched therebetween.

Figure 8:
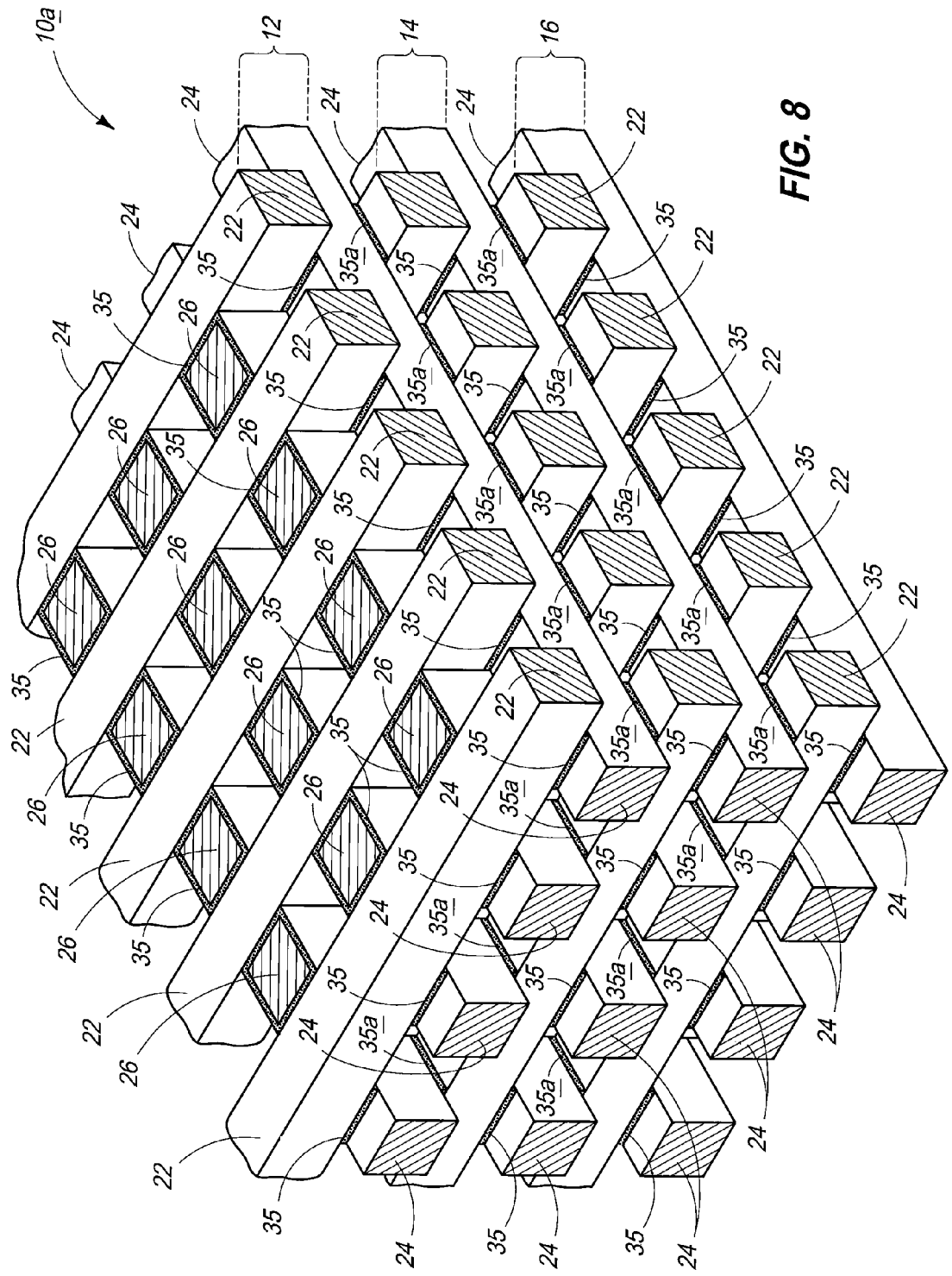
FIG. 8 is a diagrammatic isometric view of an array of nonvolatile memory cells in accordance with an embodiment of the invention.

FIG. 1 depicts an example embodiment wherein immediately adjacent pairs 12/14 and 14/16 of vertically stacked tiers of memory cells are spaced apart from each other such that no programmable material is received there-between. Accordingly, the space between such adjacent tiers 12 & 14 and 14 & 16 may be filled with/by dielectric material towards minimizing parasitic electrical interaction between adjacent of the pairs of vertically stacked tiers of memory cells. FIG. 8 depicts an alternate embodiment array 10a. Like numerals from the first-described embodiment have been used where appropriate, with some construction differences being indicated with the suffix "a" or with different numerals. In array 10a, programmable material 35a is received elevationally between the first electrode lines 24 of the elevationally inner tier 20 of one of the pair of immediately adjacent of the vertically stacked tiers of memory cells and the first electrode lines 22 of the elevationally outer tier 18 of the other of the pair of immediately adjacent of the vertically stacked tiers of memory cells. Programmable material 35a may be of the same composition as or of different composition from that of programmable material 35.

Figure 9:
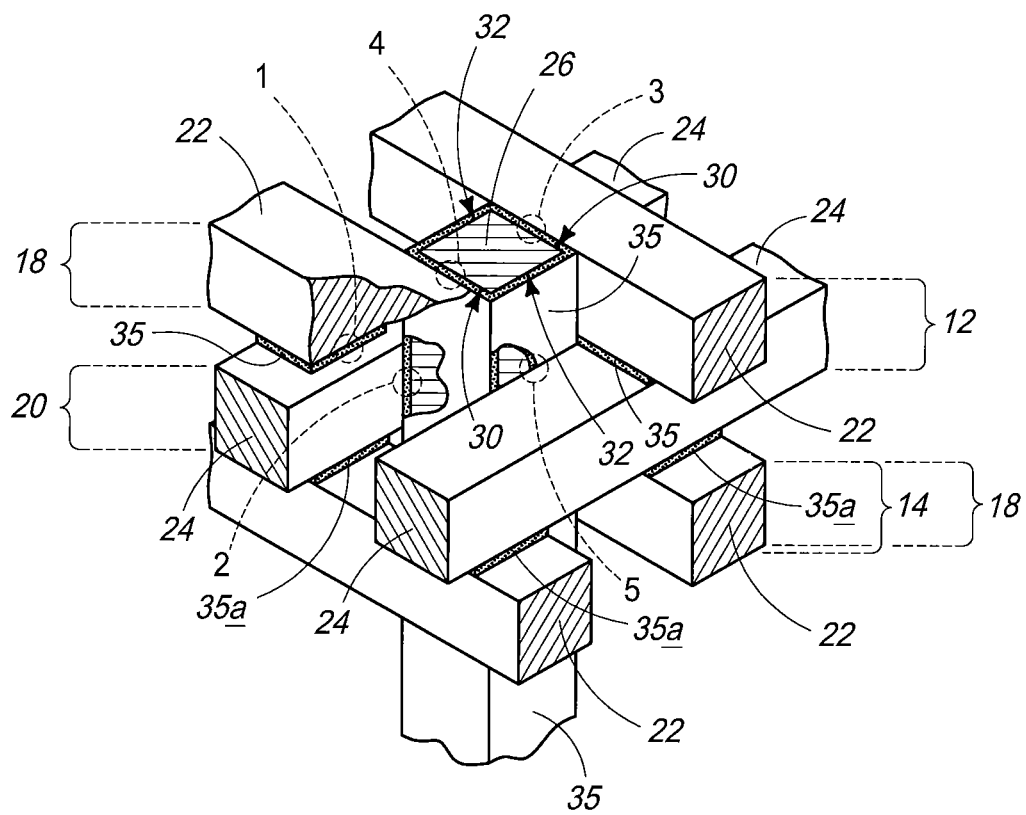
FIG. 9 is a fragmentary view of a portion of the array of FIG. 8.
Figure 10:
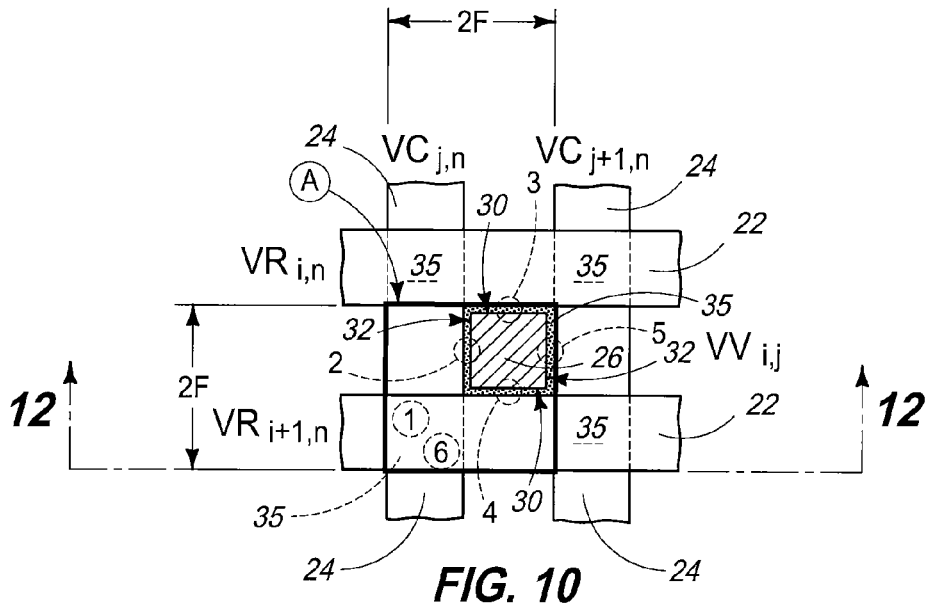
FIG. 10 is diagrammatic top view of a portion of FIG. 8.
Figure 11:
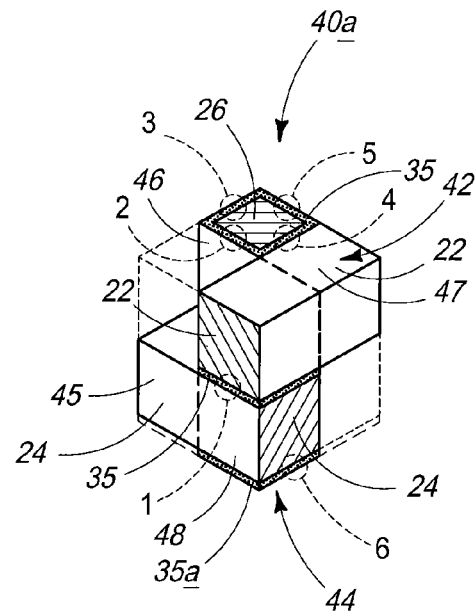
FIG. 11 is a diagrammatic view of a unit cell of the array of FIG. 8 in accordance with some embodiments of the invention.
Figure 12:
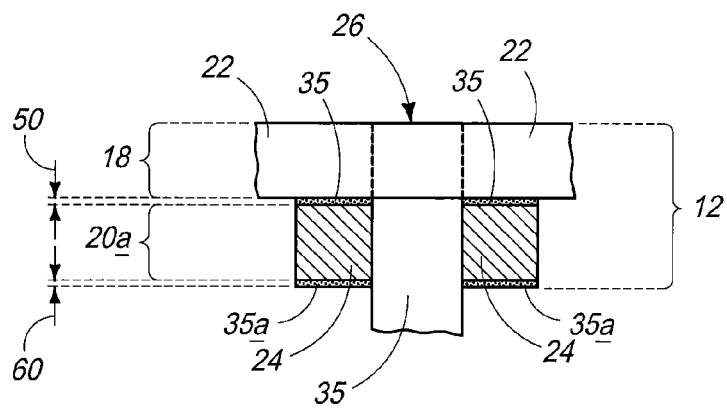
FIG. 12 is a sectional view taken through line 12-12 in FIG. 10.

The embodiment of FIG. 8 may be considered as extending the unit cell either of downwardly or upwardly to encompass one of the regions of programmable material 35a that is received between the immediately adjacent pairs of vertically stacked tiers of memory cells 12, 14, 16. Accordingly in such example, another memory cell may be added per unit cell wherein each unit cell contains six memory cells with, in one embodiment and as shown, such occupying a horizontal area of $4F^2$. See, for example, FIGS. 9 and 10 depicting memory cells 1, 2, 3, 4, 5, 6, and FIG. 11 depicting a unit cell 40a. FIGS. 9 and 10 are the same as FIGS. 3 and 4, respectively, but diagrammatically add designation of the added memory cell 6 occupied within area A. Memory cell 6 encompasses a first electrode line 24 of one tier (i.e., tier 12), a first electrode line 22 of the immediately next lower tier (14), and programmable material 35a sandwiched therebetween. FIG. 11 is the same as FIG. 7, but additional shows unit cell 40a extending downwardly to encompass programmable material 35a. Such also constitutes an example embodiment wherein there are two horizontally oriented memory cells (1 and 6) for every four vertically oriented memory cells (2, 3, 4, and 5). Such also depicts but one example embodiment of six memory cells within a unit cell wherein two memory cells other than the first-stated four are received in a corner volume of the hexahedron which is diagonally opposite the single corner volume within which the first-stated four memory cells are received. Such also constitutes yet another elevational region 60 (FIG. 12) of programmable material 35a which comprises another memory cell (memory cell 6) of the unit cell.

Figure 13:
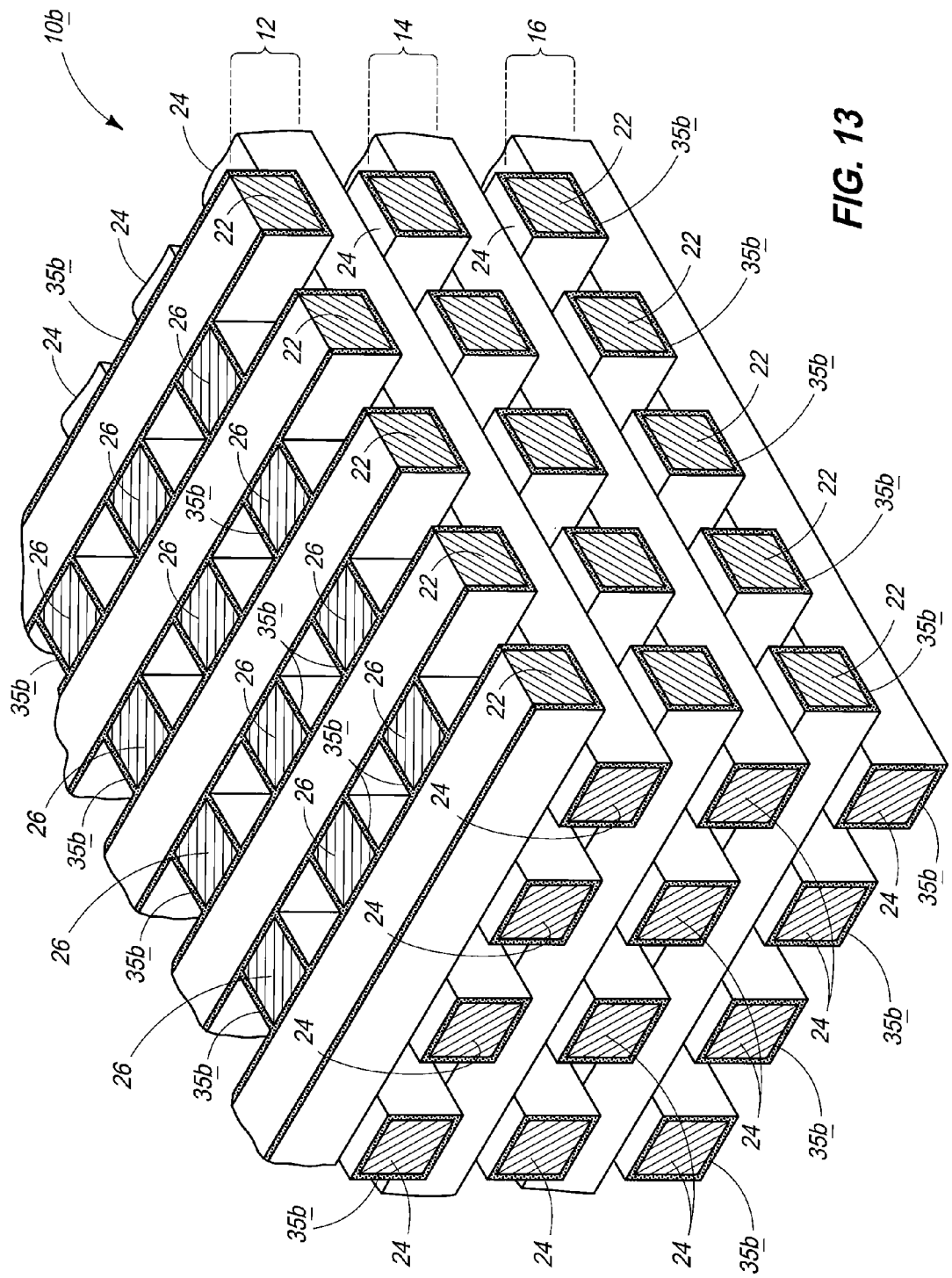
FIG. 13 is a diagrammatic isometric view of an array of nonvolatile memory cells in accordance with an embodiment of the invention.

FIG. 8 depicts an example embodiment wherein programmable material 35/35a is largely only received between immediately adjacent conductive electrode lines. FIG. 13 depicts another example array 10b. Like numerals from the above-described embodiments have been used where appropriate, with some construction differences being indicated with the suffix "b". In array 10b, programmable material 35b has been deposited everywhere as a blanketing conformal layer.

An individual unit cell 40 of memory array 10 may be considered as comprising five electrode lines, four of which run horizontally relative to either "x" or "y" axes. For an individual tier 12, 14, 16 designated as "n", those lines 24 which run relative to the "x" axis are additionally individually designated as $VR_i$; and $VR_{i+1}$ in FIG. 4. Those lines 22 which run relative to the "y" axis are additionally individually designated as $VC_j$ and $VC_{j+1}$ in FIG. 4. The fifth line is encompassed by a single vertically extending second electrode line 26 which is additionally designated as VV in FIG. 4. Table I below shows example relative absolute values of relative voltages V that may be used in reading, writing or erasing any individual of cells 1, 2, 3, 4, 5 of FIGS. 1-7 within an individual tier "n". The example Table I biasing scheme may rely on non-linearity of an individual cell's current-voltage characteristics, which may be intrinsic or through select devices referred to above, for example, diodes.

TABLE I

| | Horizontal X | | Horizontal Y | | Vertical | All other VR, |
| | $VR_{i,n}$ | $VR_{i+1,n}$ | $VC_{j,n}$ | $VC_{j+1,n}$ | $VV_{i,j}$ | VC, and VV |
|---|---|---|---|---|---|---|
| Cell 1 | 0 | 1/2 V | V | 1/2 V | 1/2 V | 1/2 V |
| Cell 2 | 1/2 V | 1/2 V | 0 | 1/2 V | V | 1/2 V |
| Cell 3 | 0 | 1/2 V | 1/2 V | 1/2 V | V | 1/2 V |
| Cell 4 | 1/2 V | 0 | 1/2 V | 1/2 V | V | 1/2 V |
| Cell 5 | 1/2 V | 1/2 V | 1/2 V | 0 | V | 1/2 V |

Table II below is an analogous corresponding table for memory cells 1, 2, 3, 4, 5, and 6 of the embodiments of FIGS. 8-13 for tiers n (12) and n+1 (14) in FIG. 9.

TABLE II

| | Horizontal $X_n$ | | Horizontal $Y_n$ | | Vertical | Horizontal $X_{n+1}$ | | All other VR, |
| | $VR_{i,n}$ | $VR_{i+1,n}$ | $VC_{j,n}$ | $VC_{j+1,n}$ | $VV_{i,j}$ | $VR_{i,n+1}$ | $VR_{i+1,n+1}$ | VC, and VV |
|---|---|---|---|---|---|---|---|---|
| Cell 1 | 0 | 1/2 V | V | 1/2 V | 1/2 V | 1/2 V | 1/2 V | 1/2 V |
| Cell 2 | 1/2 V | 1/2 V | 0 | 1/2 V | V | 1/2 V | 1/2 V | 1/2 V |
| Cell 3 | 0 | 1/2 V | 1/2 V | 1/2 V | V | 1/2 V | 1/2 V | 1/2 V |
| Cell 4 | 1/2 V | 0 | 1/2 V | 1/2 V | V | 1/2 V | 1/2 V | 1/2 V |
| Cell 5 | 1/2 V | 1/2 V | 1/2 V | 0 | V | 1/2 V | 1/2 V | 1/2 V |
| Cell 6 | 1/2 V | 1/2 V | V | 1/2 V | 1/2 V | 0 | 1/2 V | 1/2 V |

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. An array of nonvolatile memory cells comprising a repetition of a unit cell, the unit cell being the smallest, simplest polyhedron that embodies all structural characteristics of, and by three-dimensional repetition makes up, a lattice of the array; the array comprising five memory cells per unit cell, the unit cell comprising a plurality of electrode lines having programmable material there-between, the electrode lines extending through the polyhedron.

2. The array of claim 1 wherein there are only five memory cells per unit cell.

3. The array of nonvolatile memory cells of claim 1 wherein the five memory cells occupy a horizontal area of $4F^2$.

4. The array of claim 1 wherein there are only six memory cells per unit cell.

5. The array of claim 4 wherein the six memory cells occupy a horizontal area of $4F^2$.

6. The array of claim 1 wherein the array comprises a plurality of vertically oriented memory cells and a plurality of horizontally oriented memory cells, the vertically oriented memory cells being characterized by predominant current flow through the programmable material in a horizontal direction, the horizontally oriented memory cells being characterized by predominant current flow through the programmable material in a vertical direction.

7. The array of claim 6 comprising more vertically oriented memory cells than horizontally oriented memory cells.

8. The array of claim 6 wherein there are only five memory cells per unit cell, and there is one horizontally oriented memory cell for every four vertically oriented memory cells.

9. The array of claim 6 wherein there are only six memory cells per unit cell, and there are two horizontally oriented memory cells for every four vertically oriented memory cells.

10. The array of claim 1 wherein the unit cell is a hexahedron.

11. The array of claim 1 wherein some of the electrode lines are data/sense lines and another some of the electrode lines are access lines.

12. The array of claim 1 wherein the programmable material comprises at least one of ion conductive material, multi-resistive state metal oxide-comprising material, and memristive material.

13. An array of nonvolatile memory cells comprising a repetition of a unit cell, the unit cell being the simplest polyhedron that embodies all structural characteristics of, and by three-dimensional repetition makes up, a lattice of the array; the array comprising five memory cells per unit cell, the unit cell being a hexahedron having four corner volumes extending between two opposing faces of the hexahedron and the five memory cells comprise programmable material, the programmable material of four of the memory cells extending from one or the other of the opposing faces to inside the hexahedron within a single of the four corner volumes, the unit cell comprising a plurality of electrode lines having the programmable material there-between, the electrode lines extending through the polyhedron.

14. The array of claim 13 wherein the programmable material of another memory cell other than the four is received in the corner volume of the hexahedron diagonally opposite the single corner volume.

15. The array of claim 14 wherein the four memory cells are each vertically oriented and the another memory cell is horizontally oriented.

16. The array of claim 13 wherein the unit cell comprises six memory cells comprising programmable material, the programmable material of two memory cells other than the four being received in the corner volume of the hexahedron diagonally opposite the single corner volume.

17. The array of claim 16 wherein the four memory cells are each vertically oriented and the two memory cells are horizontally oriented.

18. An array of nonvolatile memory cells comprising a repetition of a unit cell, the unit cell being the simplest polyhedron that embodies all structural characteristics of, and by three-dimensional repetition makes up, a lattice of the array; the array comprising a plurality of the unit cells which individually comprise three elevational regions of programmable material, the three elevational regions comprising the programmable material of at least three different memory cells of the unit cell.

19. The array of claim 18 wherein the three elevational regions comprise the programmable material of at least four different memory cells of the unit cell.

20. The array of claim 19 wherein the three elevational regions comprise the programmable material of five different memory cells.

21. The array of claim 19 comprising another elevational region of programmable material and which comprises another memory cell of the unit cell, the unit cell comprising six different memory cells.

22. The array of claim 18 wherein the unit cell is a hexahedron.

23. The array of claim 18 wherein the elevational regions extend laterally parallel one another within individual of the unit cells.

24. The array of claim 18 wherein the elevational regions are of constant respective elevational thickness within individual of the unit cells.

25. The array of claim 24 wherein the elevational regions are of at least two different elevational thicknesses within individual of the unit cells.

26. The array of claim 25 wherein the elevational regions are of only two different elevational thicknesses within individual of the unit cells.

27. The array of claim 26 wherein an elevationally outermost and an elevationally innermost of the three elevational regions are of the same thickness within individual of the unit cells.

28. The array of claim 27 wherein the elevationally outermost and the elevationally innermost of the three elevational regions are thicker than a middle of the three elevational regions sandwiched there- between within individual of the unit cells.

29. The array of claim 18 wherein the at least three elevational regions do not elevationally overlap.

30. An array of vertically stacked tiers of nonvolatile memory cells comprising a continuous volume having a combination of a plurality of vertically oriented memory cells and a plurality of horizontally oriented memory cells, individual of the memory cells comprising programmable material, the vertically oriented memory cells being characterized by predominant current flow through the programmable material in a horizontal direction, the horizontally oriented memory cells being characterized by predominant current flow through the programmable material in a vertical direction.

31. The array of claim 30 comprising more vertically oriented memory cells than horizontally oriented memory cells.

32. The array of claim 31 wherein there is one horizontally oriented memory cell for every four vertically oriented memory cells.

33. The array of claim 31 wherein there are two horizontally oriented memory cells for every four vertically oriented memory cells.

34. The array of claim 30 wherein all of the array comprises a combination of a plurality of vertically oriented memory cells and a plurality of horizontally oriented memory cells.

35. The array of claim 30 wherein the continuous volume comprises a combination of entirely vertically oriented memory cells and entirely horizontally oriented memory cells.

36. The array of claim 28 wherein the programmable material comprises at least one of ion conductive material, multi-resistive state metal oxide-comprising material, and memristive material.

37. An array of vertically stacked tiers of nonvolatile memory cells, individual of the vertical tiers comprising:
   an elevationally outer tier and an elevationally inner tier of respective pluralities of horizontally oriented first electrode lines, the first electrode lines of the outer tier crossing with respect to the first electrode lines of the inner tier;
   a plurality of vertically oriented second electrode lines extending through the inner tier and the outer tier, individual of the vertically oriented second electrode lines extending between immediately adjacent respective pairs of first electrode lines in the inner tier and in the outer tier, the individual vertically oriented second electrode lines having first and second pairs of opposing lateral sides;
   programmable material between the opposing lateral sides of the first pair and the first electrode lines in one of the inner and outer tiers and between the opposing lateral sides of the second pair and the first electrode lines in the other of the inner and outer tiers; and
   programmable material elevationally between individual first electrode lines of the outer tier and individual first electrode lines of the inner tier where such cross.

38. The array of claim 37 wherein the first electrode lines are data/sense lines and the second electrode lines are access lines.

39. The array of claim 37 wherein the first electrode lines of the outer tier are everywhere elevationally spaced from the first electrode lines of the inner tier within the array.

40. The array of claim 39 wherein the first electrode lines of the outer tier are elevationally spaced from the first electrode lines of the inner tier at least in part by programmable material between individual first electrode lines of the outer tier and individual first electrode lines of the inner tier where such cross.

41. The array of claim 34 wherein individual first electrode lines of the outer tier cross with respect to individual first electrode lines of the inner tier at about 90°.

42. The array of claim 37 wherein the first and second pairs of opposing lateral sides are oriented at about 90° relative one another.

43. The array of claim 37 wherein programmable material entirely circumferentially encircles individual vertically oriented second electrode lines within the outer tier.

44. The array of claim 37 wherein programmable material entirely circumferentially encircles individual vertically oriented second electrode lines within the inner tier.

45. The array of claim 37 wherein programmable material entirely circumferentially encircles individual vertically oriented second electrode lines within the inner and outer tiers.

46. The array of claim 37 wherein immediately adjacent pairs of the vertically stacked tiers of memory cells are spaced from each other at least in part by programmable material received elevationally between the first electrode lines of the elevationally inner tier of one of the pair of immediately adjacent of the vertically stacked tiers of memory cells and the first electrode lines of the elevationally outer tier of the other of the pair of immediately adjacent of the vertically stacked tiers of memory cells.

47. An array of vertically stacked tiers of nonvolatile memory cells, individual of the vertical tiers comprising:
   an elevationally outer tier and an elevationally inner tier of respective pluralities of horizontally oriented first electrode lines, the first electrode lines of the outer tier crossing with respect to the first electrode lines of the inner tier;
   a plurality of vertically oriented second electrode lines extending through the inner tier and the outer tier, individual of the vertically oriented second electrode lines extending between immediately adjacent respective pairs of first electrode lines in the inner tier and in the outer tier, the individual vertically oriented second electrode lines having first and second pairs of opposing lateral sides;
   programmable material between the opposing lateral sides of the first pair and the first electrode lines in one of the inner and outer tiers and between the opposing lateral sides of the second pair and the first electrode lines in the other of the inner and outer tiers; and
   immediately adjacent pairs of the vertically stacked tiers of memory cells are spaced from each other at least in part by programmable material received elevationally between the first electrode lines of the elevationally inner tier of one of the pair of immediately adjacent of the vertically stacked tiers of memory cells and the first electrode lines of the elevationally outer tier of the other of the pair of immediately adjacent of the vertically stacked tiers of memory cells.

* * * * *

UNITED STATES PATENT AND TRADEMARK OFFICE
CERTIFICATE OF CORRECTION

PATENT NO. : 9,454,997 B2  
APPLICATION NO. : 12/959015  
DATED : September 27, 2016  
INVENTOR(S) : Jun Liu Page 1 of 1

It is certified that error appears in the above-identified patent and that said Letters Patent is hereby corrected as shown below:

In the claims;

Col. 13, line 24, claim 36, please delete "claim 28" after "array of" and insert --claim 30--.

Col. 14, line 5, claim 41, please delete "claim 34" after "array of" and insert --claim 37--.

Signed and Sealed this  
Twentieth Day of December, 2016

Michelle K. Lee  
*Director of the United States Patent and Trademark Office*